United States Patent
Wei

(10) Patent No.: US 6,190,511 B1
(45) Date of Patent: Feb. 20, 2001

(54) METHOD AND APPARATUS FOR ION BEAM SPUTTER DEPOSITION OF THIN FILMS

(76) Inventor: David T. Wei, 3715 Malibu Vista Dr., Malibu, CA (US) 90265

(*) Notice: Under 35 U.S.C. 154(b), the term of this patent shall be extended for 0 days.

(21) Appl. No.: 09/020,195

(22) Filed: Feb. 6, 1998

Related U.S. Application Data

(60) Provisional application No. 60/039,616, filed on Mar. 13, 1997.

(51) Int. Cl.[7] .................................................. C23C 14/34
(52) U.S. Cl. .................................. 204/192.11; 204/298.04
(58) Field of Search ........................... 204/192.11, 298.04, 204/298.07, 192.12, 192.26; 756/345; 438/706

(56) References Cited

U.S. PATENT DOCUMENTS

| | | |
|---|---|---|
| Re. 32,849 | 1/1989 | Wei et al. . |
| 4,142,958 | 3/1979 | Wei et al. . |
| 4,855,026 * | 8/1989 | Sioshansi ........................ 204/298.04 |
| 5,089,746 | 2/1992 | Rosenblum et al. . |
| 5,160,576 * | 11/1992 | Robbins ........................... 204/192.33 |
| 5,240,583 | 8/1993 | Ahonen . |
| 5,308,461 | 5/1994 | Ahonen . |
| 5,332,482 | 7/1994 | Sameshima . |
| 5,454,919 * | 10/1995 | Hill et al. ........................ 204/192.11 |
| 5,569,362 * | 10/1996 | Lerbert et al. ................... 204/192.26 |
| 5,693,376 * | 12/1997 | Fetherston et al. ............. 204/192.12 |
| 5,888,906 * | 3/1999 | Sandhu et al. ....................... 438/706 |

OTHER PUBLICATIONS

P. Reese Puckett et al., "Ion Beam Etching", Thin Film Processes II, pp. 749–782, 1991.*
Thin Films for Optical Systems, Chap. 6, "Ion Beam Sputtering," Wei et al., Marcel Dekker Inc., pp. 133–201 1995.
"Technology of ion beam sources used in sputtering," Kaufman, Harold R., J. Vac. Sci. Technol., Mar./Apr. 1978, pp. 272–275.

* cited by examiner

Primary Examiner—Rodney McDonald
Assistant Examiner—Gregg Cantelmo
(74) Attorney, Agent, or Firm—Townsend and Townsend and Crew LLP

(57) ABSTRACT

A technique for ion beam sputter deposition of optical coatings. The technique includes the following features (i) an assist chemical emitted towards the sputter target to oppose the tendency of film growth on the target; (ii) a discriminate baffle to capture ions or assist chemicals reflected from the target; (iii) a screen chemical to protect the coating area from the assist chemical; (iv) compartmentalized of the coating chamber to reduce crossing effects between the different chemicals (D.W.) (C.L.); (v) a compartmentalized assist ion beam to modify the coating and to reduce microstructure, defects and impurities in the coating (D.W.) (C.L.); and (vi) to combine the above features or multiply use one of the above features to further advantage or to increase throughput.

8 Claims, 2 Drawing Sheets

Figure 1: Prior Art

METHOD AND APPARATUS FOR ION BEAM SPUTTER DEPOSITION OF THIN FILMS

This application is a provisional that claims benefit to Ser. No. 60/039,616 filed Mar. 13, 1997.

BACKGROUND

A. Technical Field

This invention relates to the sputter deposition of material. More particularly, it relates to the ion beam sputter deposition of thin films. Such thin films may be used for optical coatings or other applications.

B. Related Art

A comprehensive literature of the history of depositing multiple layer optical coatings (commonly called optical films) by ion beam sputtering can be found in David T. Wei, Harold R. Kaufman and Cheng-Chung Lee, 'Ion Beam Sputtering,' Chapter 6 of 'Thin Films for Optical Systems,' ed. by F. R. Flory, publ. by Marcel Dekker, New York, (1995) [Reference 1] patent relating to fabricating multi-layer optical coatings includes David T. Wei and Anthony W. Louderback, U.S. Pat. No. 4,142,958, 'Method for Fabricating Multi-Layer Optical Films,' (1979) [Reference 2]

Up to this date, optical coatings made by ion beam sputtering have the lowest optical losses and are the most stable environmentally. In commercial production, they are also very uniform and reproducible lot-to-lot. Ion beam sputter-coated mirrors are crucial for ring-laser gyroscope (RLG) and laser interferometer gravitational-wave observatory (LIGO). Also, other ion beam sputter deposited coatings are in high demand for high precision laser instruments.

Optical coatings may have a rugate filter structure, which is a single layer of film having a continuously varying refractive index along a thickness direction with a number of minima and maxima in the index. A review of rugate filter structures is given in R. E. Johnson and R. L. Crane, "An overview of rugate filter technology," Int. Conf. Optical Interference Coatings, TuFl, pp. 118–121 (Tucson, Ariz., Apr. 12–15, 1988) [Reference 3]

The art of Sputter Deposition (sputtering for short) can be classified into two types: plasma sputtering and ion beam sputtering.

i. Plasma Sputtering

In this type, the main chamber of a vacuum system is maintained at a residual pressure around 10 millitorr by an inert, ionized sputter-gas (for example, argon) called a plasma. This plasma bombards a material target (for example, titanium) and sputters its surface off, atom-by-atom. The sputtered material is in turn deposited on another disc (called a substrate) as a thin film. In case of optical coating, the substrate should be optically transparent, and a tenuous plasma of reactive gas (for example, oxygen) is usually added to the sputter-gas to turn the film into a titanium dioxide film. Meanwhile, the titanium target's surface gets oxidized, too.

Plasma can be generated from the gas atoms by collision with electrons driven by either a direct current or a radio-frequency potential, which are traditionally called DC sputtering and RF sputtering, respectively. If the plasma bombardment is intensified by the use of strong magnetic field confinement, the set up is called magnetron sputtering.

Another technique using a plasma is plasma-assist coating. Plasma-assist coating is a hybrid using a plasma to bombard the thin film deposited by the traditional evaporation method in order to improve the film's micro-structure.

Plasma sputtering generally needs a certain concentration of gas molecules, typically 1 to 10 millitorr of residual pressure, to operate. At this concentration, intermolecular collisions are frequent, and undesirable contamination and charge damage to the film is more difficult to eliminate than at lower concentrations.

ii. Ion Beam Sputtering

In this class of sputtering, the deposition is the result of an ion beam bombarding a target material. The ion beam is a uniform flow of ions accelerated to a predetermined energy and is charge-neutralized. High optical quality ion beam sputtered coatings have gained recognition (Reference 2) since 1979, when a class of broad beam ion sources attributed to Kaufman (Reference 4) has been used. The Kaufman-type ion source is very uniform at its orifice and has a low level of contamination. Before this time, ion beam sources (such as duoplasmatrons) used very high energy ions (up to several Mev's) with a small beam diameter at its orifice. Those prior sources resulted in relatively low sputtering efficiencies and were mostly used to deposit metal films.

In a broad beam ion source (such as, but not limited to, any type discussed in Reference 1) a gas plasma is generated by electron collisions inside the source. The ions are then extracted by a voltage of tens to several thousand volts from the source into the main vacuum chamber through an orifice such as, but not limited to, cascaded grids each contains many holes, closely spaced and aligned. A neutralizer is located immediately outside the orifice to mix electrons with the ions. The neutralized ion beam can be operated in a vacuum environment of 0.1 millitorr without expansion until it hits the target, sputtering off portions of the target material. The neutralized ion beam can be generated by either a direct current (DC) or a radio frequency (RF) potential. In addition, a constituent gas from a chemical source is aimed at the deposit in situ. Together, the sputtered target material and the constituent gas form a transparent coating.

Advantages of the above described ion beam sputter deposition (IBSD) include its relatively high uniformity and reproducibility, its relatively strict neutrality, and its relative absence of gaseous contamination. The optical films it produces have both low losses in scattering and in absorption. The refractive indices of thin films are almost as high as corresponding bulk indices. Those of titanium and tantalum oxides are very high, making them well suited for high index layers in interference coatings. However, the sputter rate of such traditional IBSD is slow, making the cost per unit area too high for many applications.

Ion beam sputtering can be performed at a residual pressure range between 0.1 to 1 millitorr. In this pressure range, the residual gas concentration is so low that molecule-to-molecule collisions are practically absent, and the unwanted effects in plasma sputtering can be avoided.

iii. References

The following numbered references are herein incorporated by reference in their entirety:

1. David T. Wei, Harold R. Kaufman and Cheng-Chung Lee, 'Ion Beam Sputtering,' Chapter 6 of 'Thin Films for Optical Systems,' ed. by F. R. Flory, publ. by Marcel Dekker, New York, (1995)
2. David T. Wei and Anthony W. Louderback, U.S. Pat. No. 4,142,958, 'Method for Fabricating Multi-Layer Optical Films,' (1979).
3. R. E. Johnson and R. L. Crane, "An overview of rugate filter technology," Int. Conf. Optical Interference Coatings, TuFl, pp. 118–121 (Tucson, Ariz., Apr. 12–15, 1988).

4. H. R. Kaufman, 'Technology of Ion Beam Sources Used in Sputtering,' J. Vac. Sci. Technol., 15, 272–276 (1978).

H. Summary of the Invention

The ideas and design of the present invention seeks to remove a number of effects that slow down and degrade the optical coating in the prior art, and also maintain its superior quality. This invention still uses ion beam sputtering deposition (IBSD), but it also uses novel chemical reactions or partitions, or both, to assist the IBSD.

For example, in the prior art, the sputter yield was limited by gas molecules (e.g., oxygen) straying away from the deposition area, reaching the target material (e.g., titanium), and reacting with the surface of the target material to form a surface film. However, in the present invention, such reactions are substantially prevented by an in situ chemical spraying of an Assist Chemical on the target surface as the sputter deposition of the ion beam progresses. This results in an increased sputter yield of the target material.

The present invention includes the following features:

1. Assist Chemical: to have a second chemical reaction to overcome the side effect of the constituent gas reaction on the target surface. Its purpose is to assist the main ion beam to speed up the sputter yield.

2. Discriminate Baffle: to block the passage of certain unwanted species of particles, such as remained flow of assist chemical, from reaching the coating deposit. Alternatively, it can also serve as a barrier for any chemical intended for treating the deposit wandering to the other parts of vacuum.

3. Screening Chemical: to activate a third chemical reaction that surrenders any assist chemical which may reach the coating.

4. Compartmentalization: to divide the vacuum chamber into two physical separated compartments: one mainly for the ion beam sputter-deposition, another mainly for performing the constituent gas reaction, each with its own exit port for exhaust of ion and vapor (low.

5. Compartmentalized Assist Ion Beam: to aim additional, value-added assist ion beam(s) toward the deposit in the compartment for performing the constituent gas reaction. The added values of their usage are: (a) precision control of the coating reaction temperature and composition simultaneously. (b) refinement of the deposit material by generating a condensation differential of the molecules deposited (those desired and those undesired) eliminating the impurities therein, and (c) permitting adjustment of surface temperature and ion energy independent from the main ion beam by means of the compartmentalization, 6. Combination of and Multiple Use of the Resources Above. The spirit and scope of the invention includes the various possible combinations of the above features. Moreover, the said chemicals, ion beam sputtering sources, and the constituent gas, targets, together with their feed instruments, discriminate baffles and partitions, are not limited to one per each type, and can be rearranged within the vacuum chamber to suit a special purpose so as improve the coating rate, the throughput, or a greater variety of coatings.

DETAILED DESCRIPTION OF THE PREFERRED EMBODIMENTS

Figure 1:
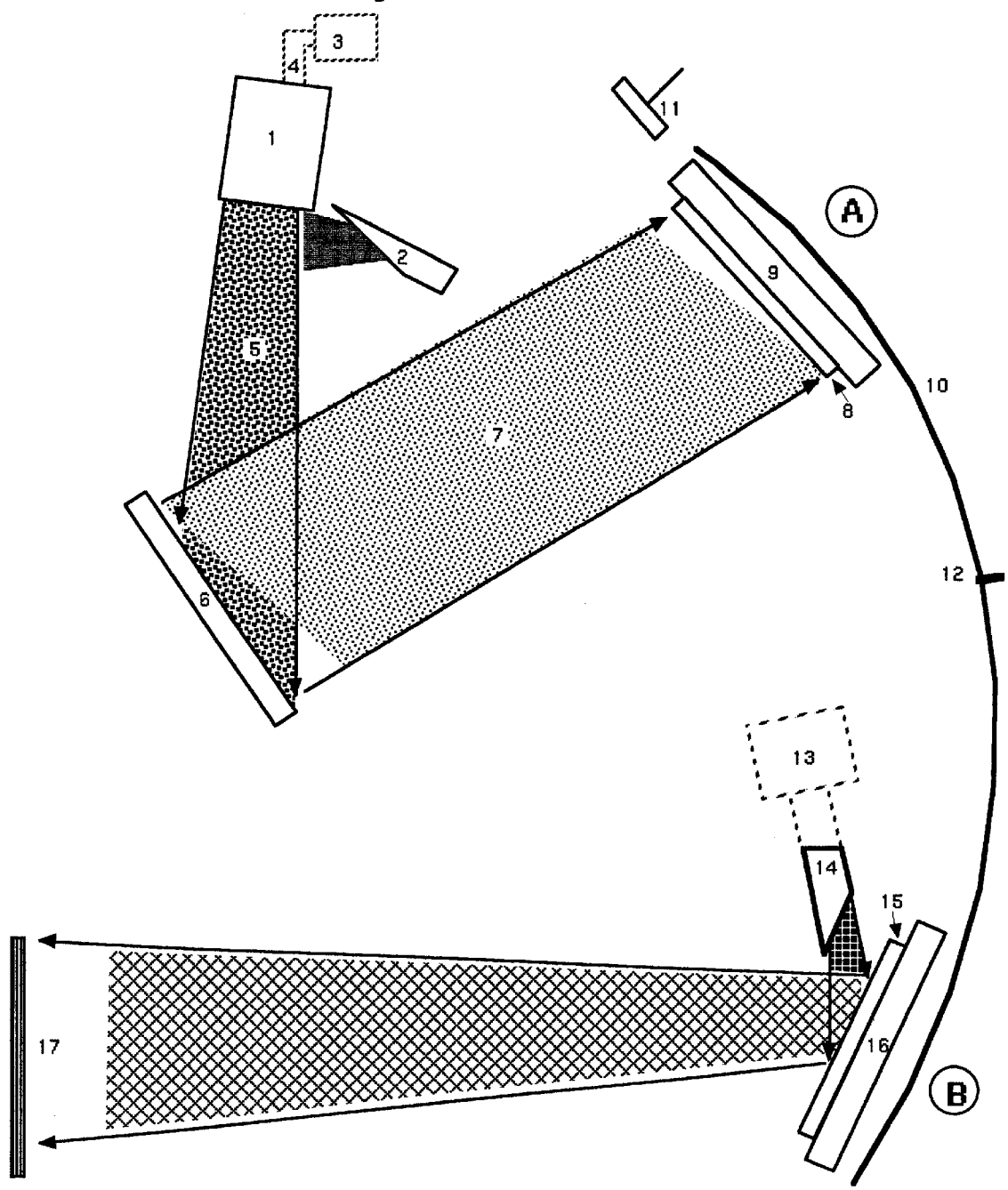
FIG. 1 is a schematic illustration of a first and conventional apparatus for ion beam sputter deposition (for a single, target and a single layer of film).

FIG. 1 is a schematic illustration of a first and conventional apparatus for ion beam sputter deposition (for a single target and a single layer of film). The main ion beam source 1 is a positively charged, broad beam ion source (Reference 1), and structure 2 is a detached, negatively charged electron emitter called "neutralizer", which are both currently commercially available (from, for example, Commonwealth Scientific Corporation, Alexandria, Va.; or Iontech, Fort Collins, Colo.). A sputter gas source (such as argon) 3 provides a sputter gas of regulated pressure enters the ion source through a regulation device 4 and emerges as a neutralized ion beam 5. Possible sputter gases include but are not limited to Ar, Kr, Xe, $O_2$, $N_2$, $CO_2$, and the other gases. The average energy of the main ion beam 1 with beam neutralizer is typically in, but is not limited to, the range of 300 volts to 3,000 volts in order of magnitude. The sputter gas partial pressure is typically in, but is not limited to, the range of 0.1 to 1 millitorr. This beam impinges on a target (possibly out of a multiple of targets) 6 and sputters off particles of the target material. Possible target materials include but are not limited to Ti, Ta, Nb, Si, Ge, Zr, Hf, V, Mo, Al, In, Ga, Hg, C, Sn, Pb, P, As, Sb, Bi, Zn, Cd, Ni, W, Au, Ag, Cu, their oxides, nitrides, fluorides, compounds and ceramics, and can even be a combination of more than one material in various proportions. The sputtered efflux 7 leaves the target and is deposited as a layer of film 8 (atop of possibly more films) on a substrate 9 which is in turn mounted on a substrate holder such as a planetary motion substrate holder (PMSH) 10. The film thickness is controlled by a crystal monitor 11. Afterwards, the PMSH 10 is rotated about an axis 12 through half a circle.

A reactive chemical source 13 emits a constituent gas through a jet 14 toward a previously sputter-deposited layer of film 15 on substrate 16 (and now moved to this position). The constituent gas 14 modifies the film composition. Possible constituent gases include but are not limited to $O_2$, $N_2$, $NH_3$, CO, $H_2S$, $H_2Se$, and $H_2Te$. Finally, a port 17 pumps out gas residues as much as possible from the vacuum chamber (whose walls are the figure frame). By similar procedure, a number of film layers from different target materials (not shown) are deposited layer by layer on these substrates to form optical coatings. All of the above items are standard from the prior art such as those described in Reference 1.

According to the literature in Ion Beam Sputtered Optical Interference Coatings, one can either (a) make a plurality of dielectric (and metal) layers (Reference 1) of sputtered deposit on a given substrate, each having a thickness determined by the wavelength and the bandwidth required by optics; or equivalently, (b) make a continuous film coating (Reference 3 W.W.) (C.L.) by varying the refractive index whose maxima and the minima correspond to the individual indices of the discrete design in (a). Thus, ion beam sputter deposition (IBSD) is consistently able to achieve environmentally stable coatings and a sharp reduction of parasitic effects (such as: optical scattering and absorption) unsurpassed by any other method. The same technology has also been extended to longer and shorter wavelengths than the visible spectrum (infrared, ultraviolet and x-ray regions).

It is a common belief that, to achieve absorption as low as several parts per million level (ppm), chemical composition of each optical layer should be nearly stoichiometric. For example, in a binary layer (such as titanium dioxide), the ratio of the constituents should be an integer or a simple fraction (e.g., 1, 3/2, 2, 5/2, 3, etc.). In order to achieve the stoichiometry of each layer (or stoichiometry through a given depth in a continuous film), a constituent gas (e. g., oxygen) is fed into the vacuum chamber at a low pressure (typically $10^{-2}$ millitorr or more). Furthermore, to achieve a binary compound coating such as titanium dioxide in prior art, the target material can be metallic titanium and the oxidation process should ideally takes place at the sputter deposit on coating according to the chemical reaction (Ref. 1),

$$Ti+O_2 \longrightarrow Ti_2 \qquad (1).$$

There is a broad problem in prior art IBSD. In addition to the coating, the constituent gas also reacts with the target. A fraction of the oxygen molecules in the vacuum find their way to the target's front surface and forms a thin layer of titanium dioxide which has a high bonding strength to the target that lowers the sputter yield. Also, some high momentum ions find their way to the coating and re-sputter the deposit. In this fashion, they both reduce the overall coating rate by a large percentage. There is no apparatus to stop the crossing of the gas and ion residues, the constituent gas can reach the target whereas the ions can reach the film, which are both harmful. As a result, the deposit rate of IBSD is much lower than many other coating methods. The typical deposit time of a quarter-wave layer titanium dioxide (at 632.8 nm laser line) takes much more than ten minutes to form under optimum condition.

Purposes of the present invention include improving the coating rate and throughput of IBSD and achieving a greater variety of thin film coatings with IBSD. As needed, we shall refer the ion beam 5 above as the "main ion beam" and the constituent gas 14 as the "first reactive chemical."

Figure 2:
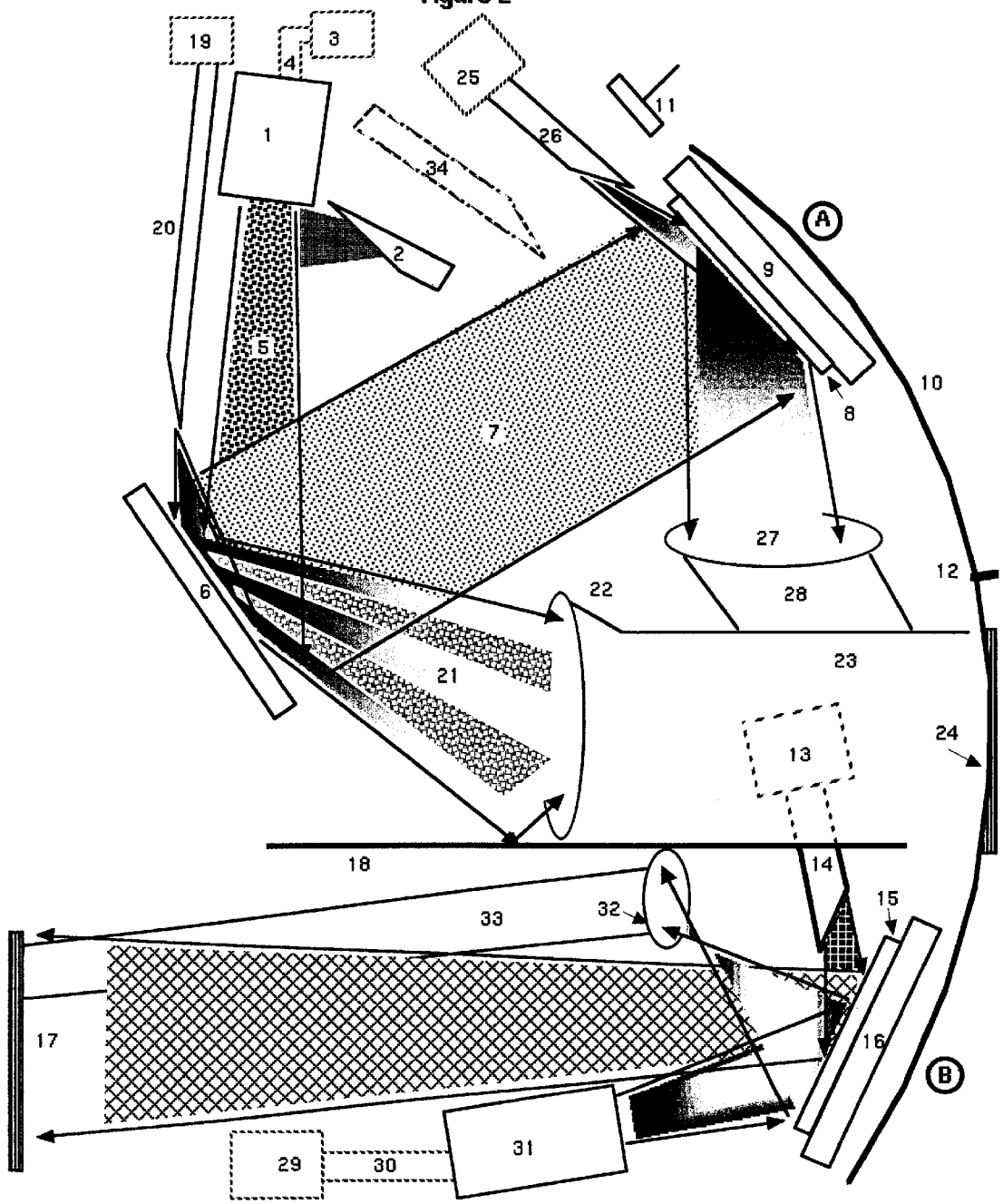
FIG. 2 is a schematic illustration of a second and preferred apparatus for ion beam sputter deposition (again, for a single target and a single layer of film) according to the present invention.

FIG. 2 is a schematic illustration of a second and preferred apparatus for ion beam sputter deposition (again, for a single target and a single film, although the scope of the invention also includes multiple targets and multiple films) according to a preferred embodiment of the present invention. In addition to including the features of the first apparatus shown in FIG. 1, the second apparatus includes various additional features. The design of the second apparatus implements an improved ion beam sputter deposition technique with multiple chemical-assists, and divides the vacuum chamber into two compartments to reduce crossing effects of the chemicals, thereby improving the throughput and the quality of optical coatings. Also, multiple use of the various features in the instrumentation can lead to a greater variety of optical coatings not attainable by the prior art IBSD.

A wall 18 partitions most of the vacuum chamber into two compartments, A and B, but still allows the substrate holder (PMSH) 10 free to move across (to rotate on its axis) with all the loads between the two compartments. An assist chemical 19 is introduced into compartment A by a jet 20 toward the target 6 as a vapor in addition to the ion beam 5. Possible assist chemicals include but are not limited to $CF_4$, $SiF_2$, $NF_6$, $F_2$, $Cl_2$, $Br_2$, $I_2$ and $H_2$. The assist chemical partial pressure is typically in, but is not limited to, the range of 0.1 to 10 millitorr. This chemical modifies the target surface to enhance the sputter rate of the ion beam substantially. The unconsummated residues of both the assist chemical vapor and the ion beam are reflected into an overlapped cone shape passage, as indicated by the shaded area 21 between two arrows. The majority of these residues can be trapped by a channel comprising the partition 18, a baffle 22 and a tubing 23, and made to exit via a second pumping port 24.

A screen chemical vapor 25 is emitted via a jet 26 to capture the impurities in the efflux 7 by reacting with the assist chemical and render it harmless. Possible $O_2$, $N_2$, $NH_3$, and $H_2O$. The screen chemical partial pressure is typically in, but is not limited to, the range of 0.01 to 10 millitorr. The exhaust vapor exits through the second port 24 through baffle 27 and channel 28. This completes the set up in compartment A. An optional constituent gas inlet 34 has the freedom to share the jet (or some other integrated feed instrument) with the screen chemical vapor.

In the lower compartment B, the constituent gas jet 14 emits the constituent gas as described above in relation to FIG. 1. With the partition, however, a higher vapor pressure may be sustained to enhance reaction of the gas with the sputtered deposit to form the modified material (such as: $O_2$ reacts with Ti to form $TiO_2$).

An assist ion beam, originated from gas source 29 via regulation device 30 and ion beam source 31, also impinges on the film layer 15. The ion beam includes the mixture of a noble gas and at least one of the constituent gases. The average energy of the assist ion beam with beam neutralizer is typically in, but is not limited to, the range of 30 volts to 300 volts in order of magnitude. The assist ion beam partial pressure is typically in, but is not limited to, the range of 0.01 to 10 millitorr. The assist ion beam provides controls to the temperature and composition of the layer, and refines the layer's deposit low in contaminants (such as impurity $TiCl_4$). Combination of the constituent gas jet 14 and the assist ion beam also allows the freedom of producing film containing two constituent gases of varying ratio (such as $TiO_{2-x}N_x$). Furthermore, suppressing reflected ion and neutral residues of constituent gases by an additional channel 32–33 to the port 17 further improves the quality and the coating rate of the deposited layer.

The following is a more detailed description of various features of the present invention.

1. Assist Chemical

An assist chemical 19 can be fed by a stand-alone jet 20 but can also be mixed into the main ion beam 5 by combining the two sources. Presented as a very low pressure vapor (or neutralized ions), the assist chemical 19 can be of one of the following two categories. (a) It can be a reducing agent such as hydrogen to minimize a surface film on the target such as titanium oxide. The reduction corresponds to the reaction formula,

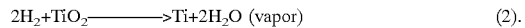

$$2H_2+TiO_2 \longrightarrow Ti+2H_2O \text{ (vapor)} \qquad (2).$$

(b) It can also be an etching agent such as chlorine to undercut the surface film by forming a volatile vapor, such as titanium chloride,

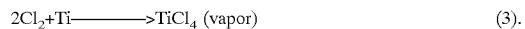

$$2Cl_2+Ti \longrightarrow TiCl_4 \text{ (vapor)} \qquad (3).$$

In either case, a function of the assist chemical is to oppose the tendency of the film growth on the target surface due to adhered constituent gas molecules. This can increase the ion beam sputter rate of the target by several folds.

2. Discriminate Baffling

Both the incident ion beam 5 and the assist chemical flux 20 can be set at high angles relative to the normal of the target 6 and nearly parallel to each other. After the impingement, each streamlet of the unconsummated ions or assist chemical molecules is elastically reflected at an angle equal to the incident angle but on the other side of the normal, due to the physical law of momentum conservation. Baffling 18, 22–23 is set up in the path of reflections to intercept the streamlets and to lead them into the second pumping port, 24. The baffling may, for example, include the partition wall 18, a funnel-shaped baffle 22, and tubing 23.

Meanwhile, the sputtered efflux is dispersed omni-directionally, and a substantial portion of the sputtered efflux should reach the coating area unobstructed.

3. Screen Chemical

The screen chemical 25 is injected as a localized, low pressure vapor within the vacuum chamber. Sprayed by a jet 26 pointing towards the coating area, it is designed to react with the assist chemical that comes nearby with and to render such assist chemical harmless to the coating. The reaction product is then pumped away via the second port 24.

Case (a). When hydrogen is used as an assist chemical, the screening gas is oxygen.

$$2H_2+O_2 \longrightarrow 2H_2O. \quad (4)$$

The water vapor can be pumped out harmlessly. Note that the screening chemical is simultaneously a constituent gas.

Case (b). When chlorine is used as an assist chemical, the screening chemical is water vapor. First, the by product of chlorine and titanium is titanium tetrachloride which can be formed at target, at coating, or in flight, $$2Cl_2+Ti \longrightarrow TiCl_4. \quad (5)$$

The titanium tetrachloride is a gas. It reacts with the water vapor to become solid titanium dioxide, which deposits as coating material, and hydrochloride which is a gas.

$$TiCl_4+2H_2O \longrightarrow TiO_2+4HCl. \quad (6)$$

Finally, hydrochloride vapor exits through the second pumping port 24 and is titrated.

4. Compartmentalization

A partition 18 divides the coating chamber into two compartments (A and B), while a substrate holder (such as PMSH) 10 transports the substrate to be coated between the compartments from 9 to 16. The upper compartment A is designed to (i) generate efflux 7 of elemental (or compound) material by sputtering; (ii) maintain a small amount of constituent gas through jet 34 to turn the element or compound into a sub-compound layer; (or to reduce the compound material into sub-compound layer, e. g., both titanium and titanium dioxide targets are known to become titanium suboxide) and (iii) suppressing the arrival of unwanted species, (the high momentum ions, assist chemical and its reaction product in vapor, and excess constituent gas). The target assembly can accomodate a multiple number of target materials 6 for producing on a substrate 9 the basic film material 8 for either a multi-layer optical coating, or a continuous coating of a single film of rugate filter structure.

Meanwhile, the lower compartment B is designed for emitting one or more constituent gas vapor (such as oxygen and/or nitrogen) 13 to seek stoichiometry in primary deposits 8 from compartment A and to turn them into (a few atomic layers at a time) optical coating 15 of desired quality (e. g., titanium dioxide with the inclusion of titanium nitride).

Being mostly somewhat far from the border between the first compartment A and the second compartment B, substrates are generally either exposed to the majority of the sputtered efflux 7, or to the majority of one or more constituent gases 13. Meanwhile, a minority of certain species of chemicals may be intentionally added in each compartment to improve the deposition speed, film quality, or just to modify the layer further. Also, the constituent gas jet 14 in B can be so oriented that the constituent gas residue, reflected and reacted by the substrate or tooling, are pumped out through the first port 17 without crossing the partition 18 to contaminate the target surface 6 in A. By moving the substrate holder 10, a coating process takes multiple steps in one compartment after another, alternately. (D.W.) (C.L)

5. Compartmentalized Assist Ion Beam

One or more broad beam ion sources (called assist ion beam sources) 31, can be added to the lower compartment B, each emits ions of a controlled mixture of at least one noble gas (such as argon) and at least one constituent gas (such as oxygen) at a relatively low voltage. Generation of ions is facilitated by either DC or RF power supplies as needed and output interface of each can be of gridded or gridless variety. The average voltage of each assist ion beam is so chosen (typically in, but not limited to, the range of 30 V to 300 V in order of magnitude) as to avoid re-sputtering the coating 15 and to perform the following functions:

a. Serving a similar functionality as the constituent gas jet 14 above, but with controlled beam spread and higher energy, in order to achieve better stoichiometry and optical properties. For example:

$$Ti\ (sputtered)+O_2(assist\ ion\ beam+jet) \longrightarrow TiO_2\ (deposit). (7)$$

b. To improve any microstructure and to fill the voids that was spontaneously grown in the layer 15.

c. To sweep away those impurity molecules who have low adhesion to the layer 15 by the momenta of the ions.

d. To obtain precision temperature control by providing proper heating from energetic constituent gas ions during film modification.

e. To perform post-deposition baking in situ by providing the effect of noble gas ion impingement This provides a means of activating the energy of a few atomic layers of the It deposit at a time. This may eliminate the need for post-deposition baking in atmosphere, so as to avoid the timeconsuming steps of (i) breaking the vacuum. (ii) manually transferring the coating product to an oven, and (iii) the baking afterwards, and so resulting in less contamination.

f. Taking advantage of the quasi-isolation of compartmentalization, the partial pressures of gases and the operating conditions of the assist ion beam 31 and the main ion beam 5 can be adjusted more independently without interfering each other.

6. Combination of Features (Fealittus 1 through 5) and Additional Instruments

Within the framework using an assist chemical, discriminate baffling, a screen chemical, compartmentalization, and an assist ion beam as discussed above, various novel optical coatings and other advantages can be achieved that were previously unachievable by the prior art. The spirit and scope of the invention includes the various possible combinations of the above features. Moreover, if more food instruments and compartments are added, the variety of achievable novel optical coatings and advantages increases. For example, an optional jet 34 in compartment A as an additional inlet for constituent gas will improve the rate of creating the thin film. It can also feed a different constituent gas to make a layer of mixed deposit such as titanium dioxide-titanium nitride. Such additional instruments may be used to achieve: (i) a faster deposition rate, (ii) better quality film, (iii) larger production volume, and (D.W.) (C.L) (iv) further modifications to the compounds deposited. The spirit and scope of the invention also includes such additional instruments.

Glossary

Assist Chemical (Gas): A chemical that changes the chemical nature of a target surface in order to make sputter yield higher. Usually in a vapor form in vacuum.

Assist Ion Source: An ion source, aiming at certain vacuum chamber area to provide neutralized ions of constituent gases, etc. for the modification of coating or target.

Coating Rate: The rate that coating becomes thicker by sputter deposition.

Compartmentalization: To construct a solid piece of partition that segregates the volume of a vacuum chamber into different compartments for different chemical process and exhausts.

Condensation Differential: The phenomenon that a substrate is heated to a temperature that certain material species condenses as deposit while some others are volatile.

Constituent Gas: Because some of the sputtered atoms are lost before being coated, a constituent gas is usually introduced into the vacuum coater to ensure the coating contains a sufficient proportion of the constituent element. The constituent gas can be oxygen and nitrogen, among others, depending on the composition of the coating. For a $TiO_2$ coating, the constituent gas would be oxygen.

Discriminate Baffle: A physical surface in the coater chamber that would prevent the ions or assist chemical vapor from reaching the coating area directly.

Feed Instrument: General term for a class of instruments that feed a chemical in the vacuum environment. It includes assist ion source, chemical jet and feed tube, among others. In this document, "jet" is used as a synonym to feed instrument.

Ion Beam Sputter Deposition (IBSD): Using the ion beam to impinge a piece of material called target. The sputtered material in turns deposits, atom-by-atom, as a layer of film on another piece of material called substrate.

Ion Beam: A column of ions emerging from an ion source (if not indicated otherwise, it is from a broad beam ion source). A broad beam has a cross section area usually 1 $cm^2$ or more, containing positive ions of approximately equal energy, emerging through a orifice with or without grids and is neutralized by an electron emitter located near the orifice.

Microstructure: Any unwanted structure in an optical coating which is much bigger than a simple (C.L.) (D.W.) molecule and smaller that an effective layer of coating.

Optical Coating: A film consists of either multiple layers of dielectrics and conductors, or is a continuous film with a variable index of refraction along its depth. The word 'optical' refers to spectral region covering visible and invisible light, including infrared, ultraviolet and x-ray.

Optical Interference Coating: An optical coating whose layers are the result from the careful deposition of material by a preferred physical or chemical means, each layer having a thickness comparable with the wavelength of the light used (see the book quoted in Reference 1). The coating is transparent only in certain spectral region made possible by the principle of optical interference. If the coating is transparent in the visible region, then it shows a color out of a rainbow spectrum with white light illumination, and is called 'interference color.'

Planetary Motion Substrate Holder (PMSH): An assembly of substrate mounts in which all substrates can perform complex motion to achieve coating uniformity. Up to two types of the motion are named after celestial motion, spin and orbital rotation.

Rugate Filter Structure. A single layer of film having a continuously varying index of refraction along a thickness direction with a number of maxima and minima in the index.

Screening Chemical (Gas): Activated near the coating surface, the chemical is used to screen out unwanted impurity which tend to be trapped under the deposit. Usually it is in vapor form under vacuum.

Sputter Gas: A gas to be used in an ion beam for sputtering; such as: argon or krypton, etc., and can be a mixture of several gases.

Sputter Rate: The rate that target becomes thinner by ion beam sputtering.

Stoichiometry In a film of binary compound, the ratio of the two constituents is identical to a pure bulk material of the same kind. For example, a titanium dioxide film is reaching stoichiometry if the number ratio of titanium to oxygen is 1:2.

Sub-compound: A film (or bulk material) whose composition has not reached the stoichiometric composition desired by the process. For example, titanium oxide, TiO and $TiO_x (x<2)$ are both sub-compounds where $TiO_2$ is the full compound desired by the process.

Vapor: A form of a material in vacuum chamber which dissociates into individual particles (of molecular size) traveling in straight lines until colliding with the chamber wall or with each other, upon which they change directions.

What is claimed is:

1. A method for depositing a film of a material onto a substrate by sputtering the material from a target in a low-pressure vacuum chamber, the method comprising:

emitting an assist chemical of adequate amount towards the target, the target being comprised of the material;

impinging a first ion beam onto the target;

forming a sputter efflux of particles of the material that are sputtered from the target by the first ion beam;

depositing the film of the material onto the substrate by deposition of the sputter efflux onto the substrate;

modifying the film with a constituent gas, stray molecules of the constituent gas forming a surface layer on the target:

removing the surface layer on the target with the assist chemical; and emitting a screen chemical towards the substrate, said screen chemical reacting with the residues of the assist chemical to form a reaction product, where said sputter efflux includes residues of the assist chemical, and wherein said material comprises titanium, the assist chemical comprises chlorine, the screen chemical comprises water vapor, the titanium and chlorine react to form titanium chloride at the target, and after being sputtered the titanium chloride reacts with the water vapor to form titanium oxide and hydrochloride vapor near the substrate.

2. An apparatus for sputter deposition of a film onto a substrate, the apparatus comprising:

a vacuum chamber;

a first target comprised of a material, said first target being within the chamber;

a first ion beam impinging onto said first target, said first ion beam reflecting from said first target and sputtering particles of the material from the target to form the film on the substrate;

a first baffle set up in a path of the reflected ion beam for collecting a portion of the reflected ion beam;

a port connected to the baffle, the port pumping gases out of the chamber;

a first jet for emitting an assist chemical towards said first target, where a portion of the assist chemical is collected by the baffle;

a second jet for emitting a screen chemical near the substrate to intercept residual assist chemical and impurities; and a second baffle set up in a path of the screen chemical for collecting a portion of the screen chemical and exhaust.

3. The apparatus of claim 2, wherein the assist chemical comprises a reducing agent.

4. The apparatus of claim 3, wherein the reducing agent comprises hydrogen, and the screen chemical comprises oxygen.

5. The apparatus of claim 2, wherein the assist chemical comprises an etching agent.

6. The apparatus of claim 5, wherein the etching agent comprises chlorine, and the screen chemical comprises water vapor.

7. The apparatus of claim 2, wherein said assist chemical comprises $CF_4$.

8. The apparatus of claim 7, wherein said screen chemical is water vapor.

* * * * *